Oct. 4, 1960 L. LAX 2,955,259
STABILISING CIRCUIT FOR TRANSISTOR AMPLIFIERS
Filed Aug. 13, 1956
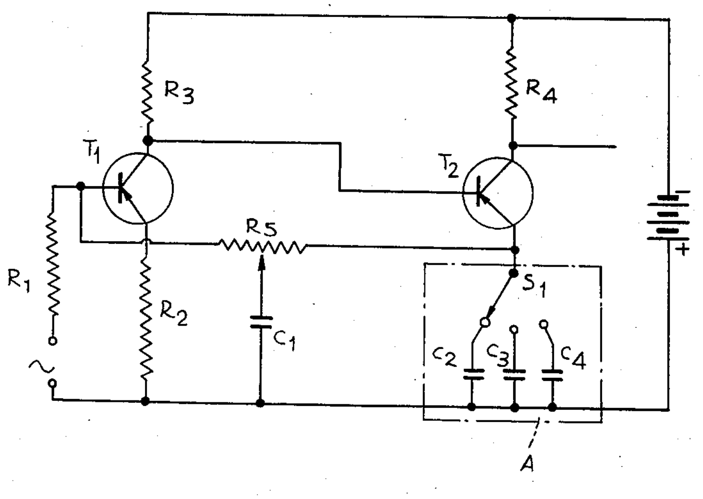
Inventor
Ladislav Lax
By Holcombe, Wetherill & Brisebois
Attorney United States Patent Office 2,955,259

Patented Oct. 4, 1960

2,955,259

STABILISING CIRCUIT FOR TRANSISTOR AMPLIFIERS

Ladislav Lax, Cambridge, England, assignor to Pye Limited, Cambridge, England, a British company Filed Aug. 13, 1956, Ser. No. 603,599

Claims priority, application Great Britain Aug. 19, 1955

2 Claims. (Cl. 330—19)

The present invention relates to electronic amplifying circuits incorporating transistors or other semi-conductor devices (hereinafter generally called "transistors") and more particularly to a stabilising circuit for stabilising the D.C. conditions in such amplifiers.

From one aspect, the invention comprises an amplifier circuit incorporating transistors, wherein compensation for a D.C. voltage change at the output of one transistor due to a change in current through said transistor is achieved by feeding back an appropriate D.C. voltage from a subsequent transistor.

From another aspect the invention consists in an electronic amplifier comprising at least two transistors, in which the D.C. voltage produced at an electrode of the second or a subsequent transistor is applied to the input electrode of an earlier transistor with appropriate polarity to compensate for D.C. voltage changes at the output of said earlier transistor due to D.C. current changes through it.

The invention also provides an electronic amplifier comprising two transistors, in which an input signal to the amplifier is applied to the base or equivalent electrode of the first transistor and a D.C. voltage is fed back from an electrode, other than the base electrode, of the second transistor to the base electrode of the first transistor in order to compensate for D.C. voltage changes across the first transistor due to D.C. current changes through said first transistor.

According to a feature of the invention, a by-pass condenser is associated with the stabilising feedback connection. By varying its position in the circuit, the A.C. gain of the amplifier can be controlled without disturbing the D.C. conditions.

In order that the invention may be more fully understood, reference will now be made to the accompanying drawing, which shows a circuit arrangement of an electronic amplifier according to the invention.

Referring to the drawing, the amplifier comprises two transistors T1 and T2. The input signal generator to the amplifier, which may comprise a microphone, driven transformer, gramophone pick-up or the like, and which presents a low D.C. resistance, is connected to the base of transistor T1 through resistor R1 which is a D.C. resistance. The emitter load of transistor T1 comprises resistor R2 and the collector load comprises resistor R3. The junction between resistor R3 and the collector of transistor T1 is connected directly to the base of transistor T2. Resistor R4 is the collector load of transistor T2. R1 and R2 can be decoupled to improve the A.C. gain and in certain circumstances R2 can be omitted. According to the invention the base of transistor T1 is connected through resistor R5 to the emitter of transistor T2, and to earth via the resistances provided by R1 and the signal generator. If the signal generator provides a suitable D.C. resistance, R1 can be omitter Resistor R5 may be provided with an adjustable tapping and a by-pass condenser C1 is connected to the tapping of resistor R5. Condensers C2, C3 and C4 shown enclosed within the rectangle A and connected to the emitter of transistor T2 through switch S1, form an additional or alternative by-pass arrangement to condenser C1.

The operation of the circuit will now be described. When D.C. current increases through transistor T1, a voltage drop occurs across resistor R3 which produces a corresponding current drop in transistor T2. This in turn produces a D.C. voltage drop at the emitter of transistor T2 which is fed back by the potentiometer formed by resistors R5, R1 and the generator resistance to the base of transistor T1, thereby tending to counteract the original current change through transistor T1.

The A.C. amplification can be increased by suppressing A.C. feedback by means of a by-pass condenser such as C1, connected to the emitter of transistor T2. According to a feature of the invention, resistor R5 may be provided with an adjustable tapping and by-pass condenser C1 is connected to this adjustable tapping. In this way, by movement of the position of the tapping on resistor R5 the gain of the amplifier can be controlled without upsetting the D.C. conditions. As shown in the drawing, when the tapping on resistor R5 is moved to the left, the impedance in the emitter lead of transistor T2 is increased reducing its gain. Further movement produces a low impedance at the base of transistor T1 reducing its input signal and thereby increasing the effect of the gain control.

Instead of the by-pass arrangement employing condenser C1, the arrangement shown within the rectangle A may be employed. In this arrangement condensers C2, C3 or C4 of different values may be selectively connected to the emitter of transistor T2 by means of switch S1 and serve to provide the necessary de-coupling and also as a frequency or tone control. Due to incomplete decoupling the amplification in transistor T2 is reduced in the lower frequency range and reduction is assisted by the negative feedback through the potentiometer network formed by resistor R5 and the input resistance.

Whilst a particular embodiment has been described, it will be understood that various modifications may be made without departing from the scope of the invention.

I claim:

1. An electronic amplifier comprising two transistors, each having a base, an emitter and a collector, means for energising said transistors, a D.C. conductive signal source connected to the base of the first transistor, a connection for feeding an output signal from the collector of the first transistor to the base of the second transistor, means for deriving a D.C. voltage from the emitter of the second transistor, a series resistor forming the only D.C. path to the emitter of the second transistor and directly connected between the emitter of the second transistor and the base of the first transistor for feeding back said D.C. voltage to the base of the first transistor across said resistor and the impedance of said signal source in order to compensate for D.C. voltage changes across said first transistor due to D.C. current changes through said first transistor, an adjustable tapping on said resistor and a condenser connected between the adjustable tapping on said resistor and a point of fixed potential, whereby the A.C. gain of said amplifier can be varied by adjusting said tapping without varying the D.C. conditions and movement of said adjustable tapping towards the end of said resistor connected to the emitter of said second transistor increasing the A.C. gain, whilst movement of said adjustable tapping towards the end of said resistor connected to the base of said first transistor decreases the A.C. gain.

2. An electronic amplifier comprising two transistors, each having a base, an emitter and a collector, means for energising said transistors, a signal source having its source impedance D.C. connected to the base of the first transistor, a direct connection for feeding an output signal from the collector of the first transistor to the base of the second transistor, means for deriving a D.C. voltage from the emitter of the second transistor, a series resistor forming the only D.C. path to the emitter of the second transistor and directly connected between the emitter of the second transistor and the base of the first transistor for feeding back said D.C. voltage over a D.C. path to the base of the first transistor across said resistor and the impedance of said signal source in order to compensate for D.C. voltage changes across said first transistor due to D.C. current changes through said first transistor, an adjustable tapping on said resistor and a condenser connected between the adjustable tapping on said resistor and a point of fixed potential, whereby the A.C. gain of said amplifier can be varied by adjusting said tapping without varying the D.C. conditions and movement of said adjustable tapping towards the end of said resistor connected to the emitter of said second transistor increasing the A.C. gain, whilst movement of said adjustable tapping towards the end of the resistor connected to the base of said first transistor decreases the A.C. gain.

References Cited in the file of this patent

UNITED STATES PATENTS

| | | |
|---|---|---|
| 2,034,226 | Carter | Mar. 17, 1936 |
| 2,320,429 | Hasbrouck | June 1, 1943 |
| 2,761,916 | Barton | Sept. 4, 1956 |
| 2,762,873 | Goodrich | Sept. 11, 1956 |
| 2,762,875 | Fischer | Sept. 11, 1956 |
| 2,786,964 | De Witt | Mar. 26, 1957 |
| 2,801,297 | Becking | July 30, 1957 |
| 2,803,712 | Hanningsberg | Aug. 20, 1957 |
| 2,847,519 | Aronson | Aug. 12, 1958 |